US006318957B1

(12) United States Patent
Carr et al.

(10) Patent No.: US 6,318,957 B1
(45) Date of Patent: *Nov. 20, 2001

(54) METHOD FOR HANDLING OF WAFERS WITH MINIMAL CONTACT

(75) Inventors: Paul R. Carr, Gilbert; Paul T. Jacobson, Phoenix; James F. Kusbel, Fountain Hills; James S. Roundy; Ravinder K. Aggarwal, both of Gilbert; Ivo Raaijmakers, Phoenix; Rod Lenz, Tempe; Nilesh Rajbharti, Peoria, all of AZ (US)

(73) Assignee: ASM America, Inc., Phoenix, AR (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/256,743

(22) Filed: Feb. 24, 1999

Related U.S. Application Data

(63) Continuation-in-part of application No. 09/113,441, filed on Jul. 10, 1998, now Pat. No. 6,158,951.

(51) Int. Cl.[7] ............................. B65G 49/07; B65G 1/133
(52) U.S. Cl. ............... 414/810; 414/749.4; 414/416.08; 414/937; 414/941; 118/500
(58) Field of Search ............................. 414/935, 937, 414/939, 940, 941, 416, 217, 800, 810, 749.1, 749.4, 416.08; 118/719, 500

(56) References Cited

U.S. PATENT DOCUMENTS

| 4,306,731 | 12/1981 | Shaw . | |
|---|---|---|---|
| 4,473,455 | 9/1984 | Dean et al. . | |
| 4,779,877 | 10/1988 | Shaw . | |
| 5,046,909 | 9/1991 | Murdoch . | |
| 5,093,550 | 3/1992 | Gerber et al. . | |
| 5,256,204 | * 10/1993 | Wu ...................................... | 118/719 |
| 5,275,521 | * 1/1994 | Wada ................................ | 414/937 X |
| 5,372,471 | * 12/1994 | Wu .................................... | 414/217.1 X |
| 5,377,476 | * 1/1995 | Bohmer et al. .................... | 414/939 X |
| 5,382,127 | * 1/1995 | Garric et al. ........................ | 414/217.1 |
| 5,388,945 | * 2/1995 | Garric et al. ........................ | 414/217.1 |
| 5,636,964 | * 6/1997 | Somekh et al. .................... | 414/941 X |
| 5,668,056 | * 9/1997 | Wu et al. ........................... | 414/783 X |

(List continued on next page.)

FOREIGN PATENT DOCUMENTS

| 0 634 784 A1 | 1/1995 | (EP) . | |
|---|---|---|---|
| 10-107114 | 4/1998 | (JP) . | |
| 10-144744 | 5/1998 | (JP) . | |
| 6-48515 A | * 2/1994 | (JP) ....................................... | 414/937 |
| WO 96/21943 A1 | * 7/1996 | (WO) . | |

OTHER PUBLICATIONS

Copy of International Search Report corresponding to PCT/US99/15593, filed Jul. 8, 1999.

*Primary Examiner*—Eileen D. Lillis
*Assistant Examiner*—Thuy V. Tran
(74) *Attorney, Agent, or Firm*—Knobbe, Martens, Olson & Bear, LLP

(57) ABSTRACT

The invention is a carrier comprising three support elements connected by an underlying frame. The periphery of a wafer rests upon the support elements. The invention also comprises a wafer handler with a plurality of arms. Spacers space the carrier above a base plate associated with a station in a wafer handling area. An arm slides beneath the frame and between the spacers, but the handler does not contact the wafer. A method of using the handler and carrier is provided where the handler lifts and rotates the carrier with the wafer through various stations in a wafer handling area. A control device reduces the handler speed only at critical points of the processing cycle. The handler is capable of moving a plurality of carriers and wafers simultaneously.

13 Claims, 7 Drawing Sheets

U.S. PATENT DOCUMENTS

| | | | |
|---|---|---|---|
| 5,669,644 | * | 9/1997 | Kaihotsu et al. ................. 414/941 X |
| 5,679,404 | * | 10/1997 | Patten, Jr. et al. ................. 427/248.1 |
| 5,841,515 | * | 11/1998 | Ohtani ............................... 414/937 X |
| 5,911,461 | * | 6/1999 | Sauter et al. ...................... 414/941 X |
| 5,970,621 | * | 10/1999 | Bazydola et al. ................. 414/940 X |
| 5,976,199 | * | 11/1999 | Wu et al. .......................... 414/939 X |
| 6,068,441 | * | 5/2000 | Raaijmakers et al. ........... 414/941 X |
| 6,099,652 | * | 8/2000 | Patten, Jr. et al. ............... 118/500 X |
| 6,158,951 | * | 12/2000 | Carr et al. ......................... 414/941 X |
| 6,162,299 | * | 12/2000 | Raaijmakers ..................... 414/936 X |

* cited by examiner

METHOD FOR HANDLING OF WAFERS WITH MINIMAL CONTACT

RELATED APPLICATION

This is a continuation-in-part of U.S. patent application No. 09/113,441 filed Jul. 10, 1998 now U.S. Pat. No. 6,158,951.

FIELD OF THE INVENTION

This invention relates to an apparatus and method for facilitating the handling and transport of semiconductor wafers, and more particularly to an apparatus and method for protectively supporting semiconductor wafers in a manner which permits easy transport between processing stations and between cassettes or other wafer transport/holding mechanisms with minimal risk of damage and contamination of the wafer.

BACKGROUND OF THE INVENTION

During semiconductor wafer processing, the wafers frequently move through several locations such as: a cassette, a load lock station where the atmosphere around the wafer is purged and the wafer may be etched, a pre-processing station where the wafer may be measured or cleaned, a reactor, and a post-processing station where the wafer is cooled, and the thickness of a deposition layer may be measured. The wafer obviously must be handled in order to move to each location; however, each time the wafer is contacted or jarred, particles may be generated, and the likelihood of backside scratching or contamination by such particles is increased. These wafers can be rendered useless for device fabrication by contamination, abrasion, or damage. Therefore, extreme care is required to support and transport wafers.

U.S. Pat. No. 5,046,909 by Murdoch teaches clipping the wafer onto a retaining ring so that the ring is handled during processing instead of directly handling the wafer. A robotic arm moves the wafer to be engaged with the clips. However, the clips contact both the top and bottom of the wafer, and great precision is required in order to initially engage the wafer with the clips.

U.S. Pat. No. 4,306,731 by Shaw, and U.S. Pat. No. 4,779,877, also by Shaw, teach an apparatus comprising a plate-like support provided with an aperture of a diameter larger than the wafer, and clip means for gripping the edge of the wafer. The leading edge of each clip has an arcuate portion within which the edge of the wafer is retained. However, the Shaw inventions require that the clip must first be spread before receiving the wafer to prevent edgewise abrasion. Thus, these inventions are rather complex because additional parts are needed to actuate the clip, such as a pneumatic cylinder and contact pin.

U.S. Pat. No. 4,473,455 by Dean et al. teaches spring-mounted members disposed around the periphery of an aperture in a wafer-mounting plate. However, once the wafer is retained within the wafer-mounting plate, the wafer cannot be moved with the plate because this invention is only for use of holding the wafer during a processing step.

European Pat. Application (Publication number 0 634 784 A1) by A. Tepman discloses a variable speed wafer exchange robot. However, the design is quite complicated, especially that of the wafer support assembly.

Consequently, a need exists for a simple wafer carrying device which is simple to use, has few parts, transportable through multiple locations, minimizes contact with the wafer, and reduces the potential for particle generation.

SUMMARY OF THE INVENTION

The present invention is a carrier that supports a wafer during most stages of wafer handling, and a method for using the carrier with a wafer handler which moves the carrier and wafer to multiple stations.

The wafer handler has multiple sensors which sense the location of the handler at different points of the processing cycle. A control device receives location information from the sensors and sends signals to a variable speed drive motor which changes the acceleration and speed of the handler based on this information. When the handler moves vertically to place or pick up the wafer carriers from the stations, the control device decreases the handler acceleration and speed to ensure a smooth transition and prevent the carriers from shifting or chattering which may cause particle generation, thereby contaminating the wafers. However, immediately after the handler picks up the carrier during the handler's motion upward or places the carrier down on a base plate, the handler accelerates and increases in speed in order to maximize throughput. The handler moves with the fastest speed when it is not transporting any wafer carriers.

An end effector removes the wafer from a cassette and places the wafer onto the carrier. The carrier has a plurality of support elements defining a wafer support plane, and a support structure or frame below the plane connecting the support elements. The periphery of the wafer rests upon the support elements. The wafer can then be moved by lifting the carrier rather than engaging the wafer.

In one example, a wafer handler arm is inserted beneath the carrier so that the handler does not contact the wafer. The wafer handler may be provided with a plurality of arms that lift and rotate a plurality of carriers with wafers from station to station. The wafers rest safely atop the carriers, so that the handling is absorbed by the carrier instead of the wafer.

After processing, an end effector removes the wafer from the carrier back to the cassette, leaving the carrier in the handling chamber for repeated use. The use of the carrier in an environment where the wafer must be repeatedly picked up and set down reduces the number of times the wafer is contacted. This reduces the amount of backside marking on the wafer. Additionally, the carrier has locating features which assist in centering the wafer to be properly positioned for processing.

DETAILED DESCRIPTION OF THE EMBODIMENT

Figure 1:
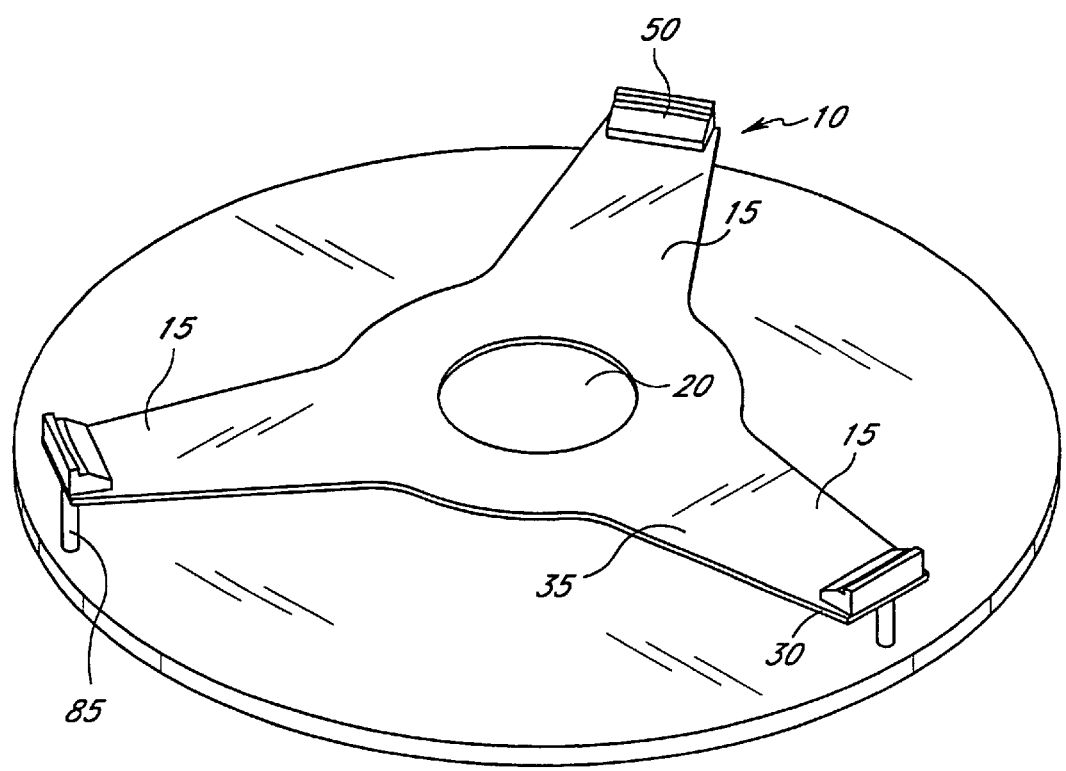
FIG. 1 is a perspective view of a wafer carrier supported by spacers extending from a base plate.
Figure 2:
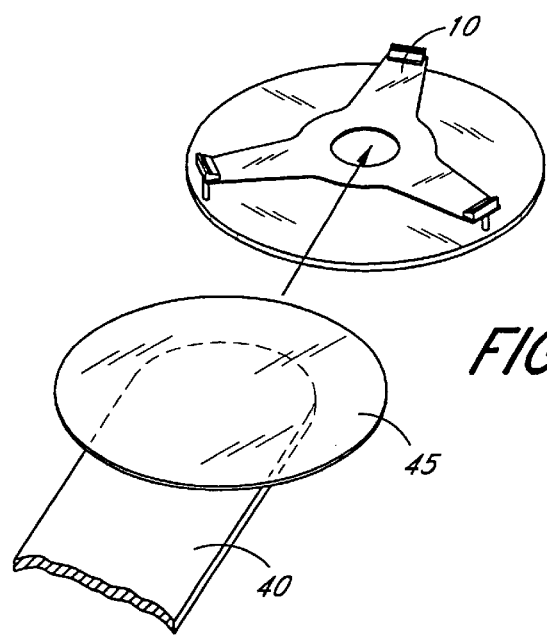
FIG. 2 is a perspective view of an end effector carrying a wafer.
Figure 3:
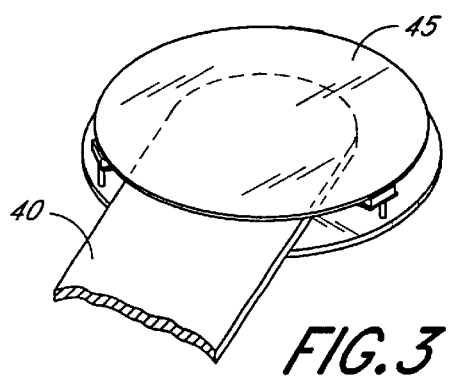
FIG. 3 is a perspective view of an end effector placing a wafer on top of the support blocks of a carrier.
Figure 4:
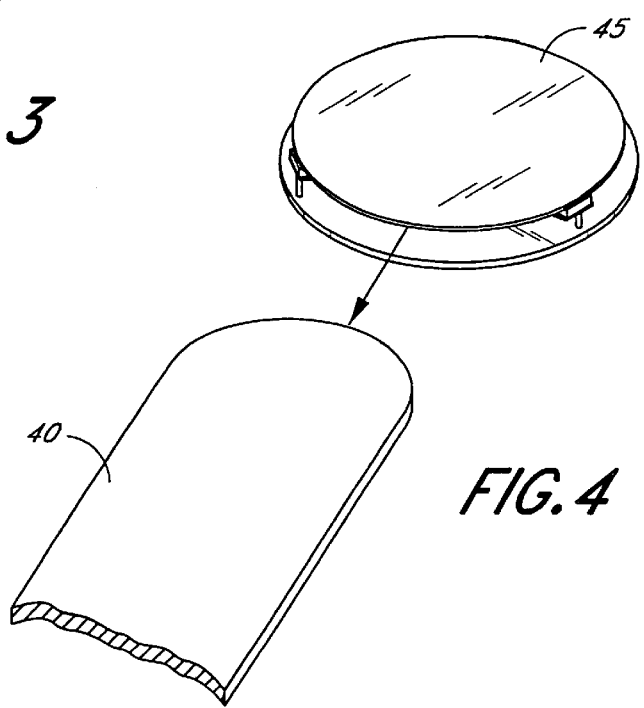
FIG. 4 is a perspective view of a withdrawn end effector after placing a wafer on top) of the support blocks of a carrier.

Referring now to the drawings, and particularly to FIG. 1, a carrier of the invention is shown schematically and indicated generally by the number 10. In a preferred embodiment, the carrier 10 is shown with a frame or structure formed by three flat arms 15 extending outward from its center and defining a generally flat wall. The carrier 10 is preferably made of a metal such as aluminum, including anodized aluminum, or a ceramic material such as alumina, or any material which will not interfere with wafer processing. The carrier 10 may have a hole 20 in its center to decrease its weight. The arms 15 have portions 35 positioned inwardly with respect to the outer ends 30. The inner portions 35 are spaced beneath the plane to enable an end effector 40 to extend beneath the plane to facilitate the transfer of a wafer 45 between the end effector 40 and the carrier 10. In the arrangement shown in FIGS. 2–4, the end effector 40 is a flat paddle, and the space between the wafer support plane and the arm portions 35 is sufficient to enable the end effector 40 to be inserted in that space. For other types of end effectors which place the wafer upon the carrier from a different position, the space may be minimal.

The configuration of the carrier 10 may be other than the "star" embodiment shown in FIG. 1, as long as the carrier provides adequate support to the periphery of the wafer, and an underlying frame or support structure connecting the points are configured so that an end effector may transfer the wafer to and from the carrier, such. as an end effector fitting into the wafer support plane and retracting after placing the wafer on the carrier.

Figure 5:
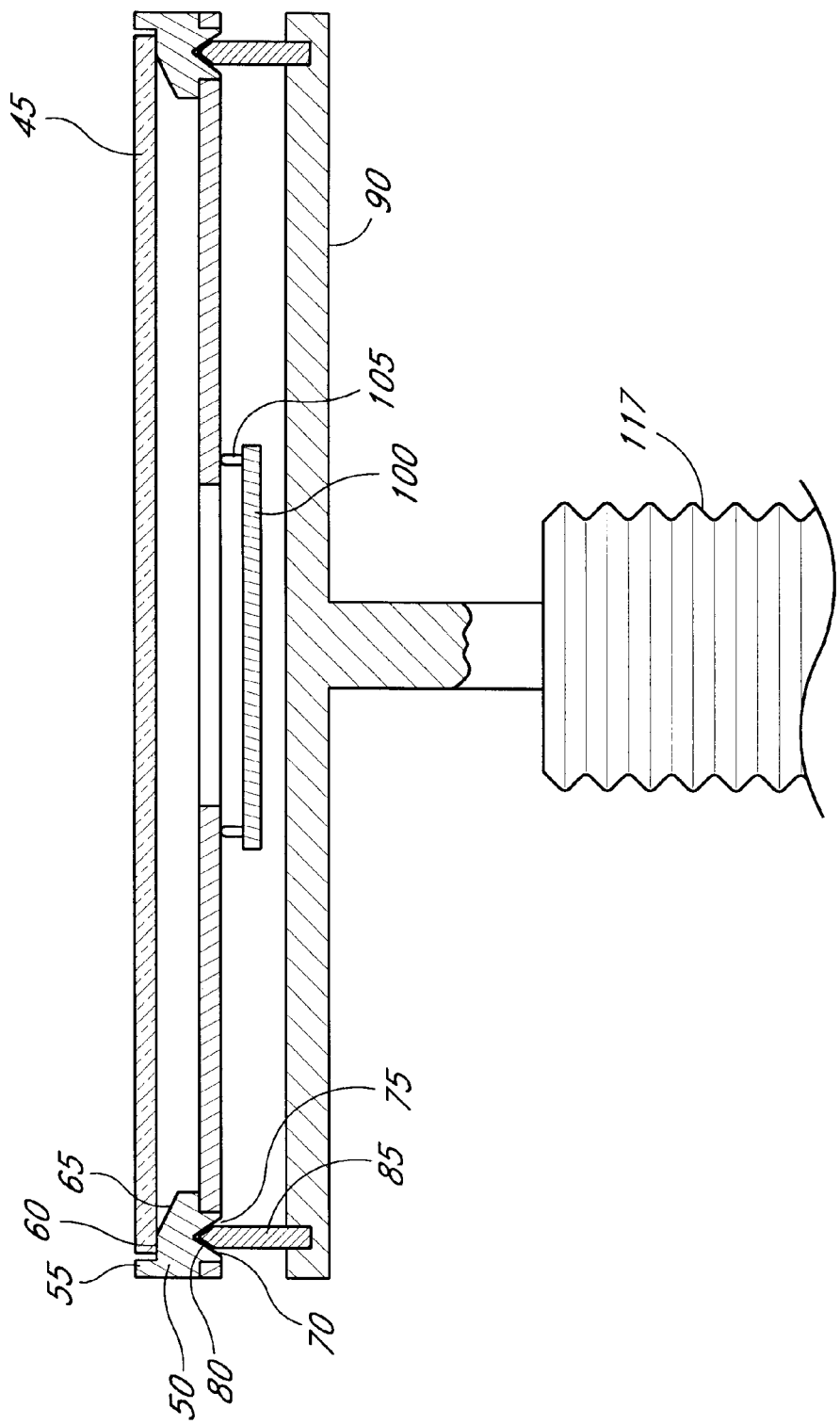
FIG. 5 is a sectional view of the carrier, an outer end of a wafer handler arm, and a base plate along line 5—5 of FIG. 7.

A wafer support block 50 is connected to the outer end 30 of each carrier arm 15. The wafer support blocks 50 define a horizontal wafer support plane. The wafer support block is preferably made of quartz or a high temperature plastic. One suitable example is polybenzimidazole sold under the trademark Celazole PBI. In the embodiment shown in FIG. 5, the block 50 has a lip 55 at the top of the periphery to restrain the wafer 45 from horizontal movement, and an upper support surface 60 upon which the wafer 45 rests. The lip 55 also helps in automatically centering the wafer when it is placed on the carrier by the end effector. The upper support surface 60 may have a chamfer 65 to minimize the contact area between the wafer support block 50 and the wafer 45. This also prevents the wafer from falling in between the blocks in case the wafer is not exactly centered. The upper support surface 60 and chamfer 65 are sized such that only the portion of the wafer which will not be used, commonly known as the "exclusion zone," contacts the wafer support block 50. Each block 50 is attached by a pair of screws (not shown) which extend through the carrier arm and thread into the block. Of course, other attachment means may be employed.

The block 50 has a protuberance 70 which is received through a hole 75 in the carrier arm 15. The protuberance 70 has a downwardly facing socket or recess 80 to receive a spacer 85. The spacer 85 may either be connected to the carrier 10 or extend upward from a base plate 90 in the wafer handling area 95 (see FIGS. 6–8). The spacers 85 create a gap between the bottom of the carrier 10 and the top of the base plate 90 where a wafer handler 25 is inserted to transport the carrier 10 and wafer 45 without contacting the wafer 45. The spacer and socket combinations help in precise positioning of the carriers as they are moved from stations to station by the handler. The carrier 10 need not have separate wafer support blocks 50, but may have support points of unitary construction with the carrier 10.

Figure 6:
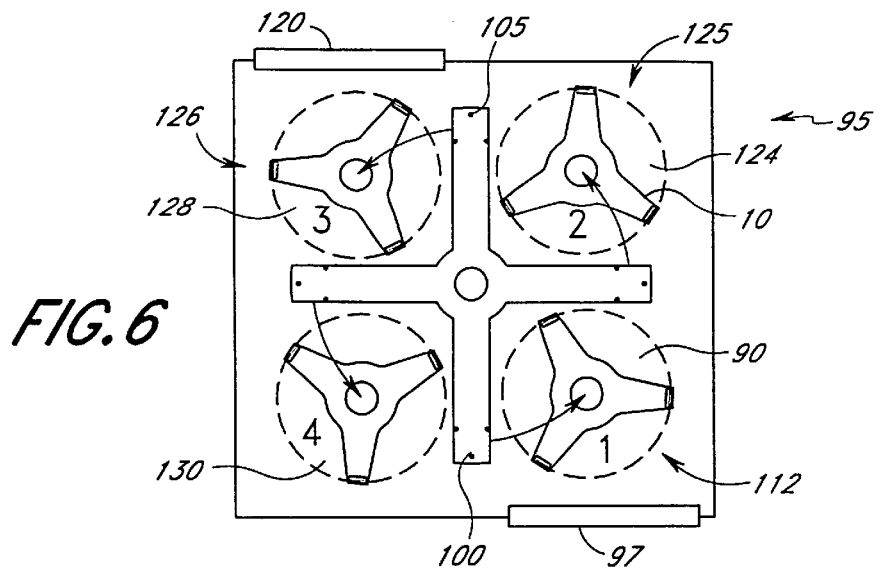
FIG. 6 is a top view of the wafer handling area where the wafer handler is in a neutral position.
Figure 7:
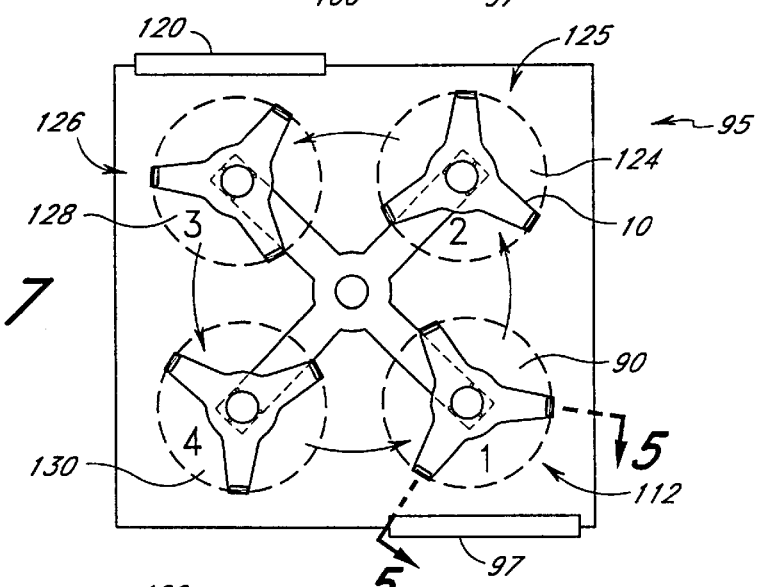
FIG. 7 is a top view of the wafer handling area after the wafer handler has rotated 45° counterclockwise so that the outer end of each wafer handler arm is beneath a carrier and above a base plate.
Figure 8:
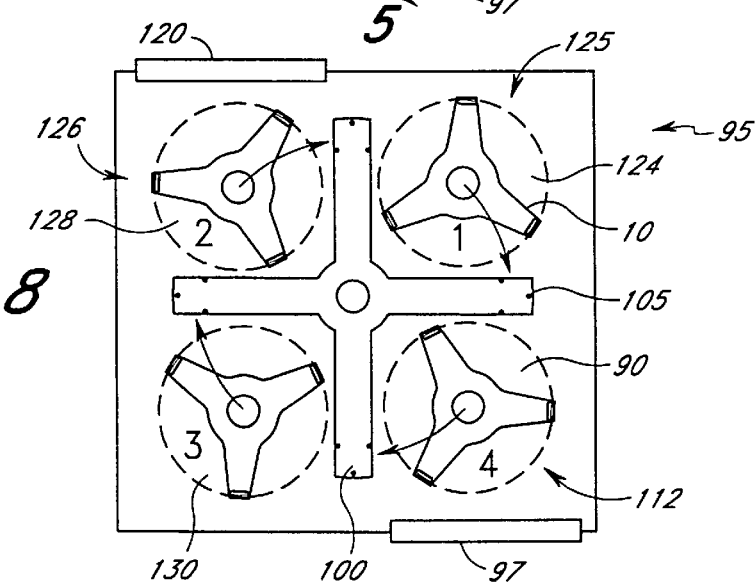
FIG. 8 is a top view of the wafer handling area after the wafer handler has moved the wafers to the next station.
Figure 9:
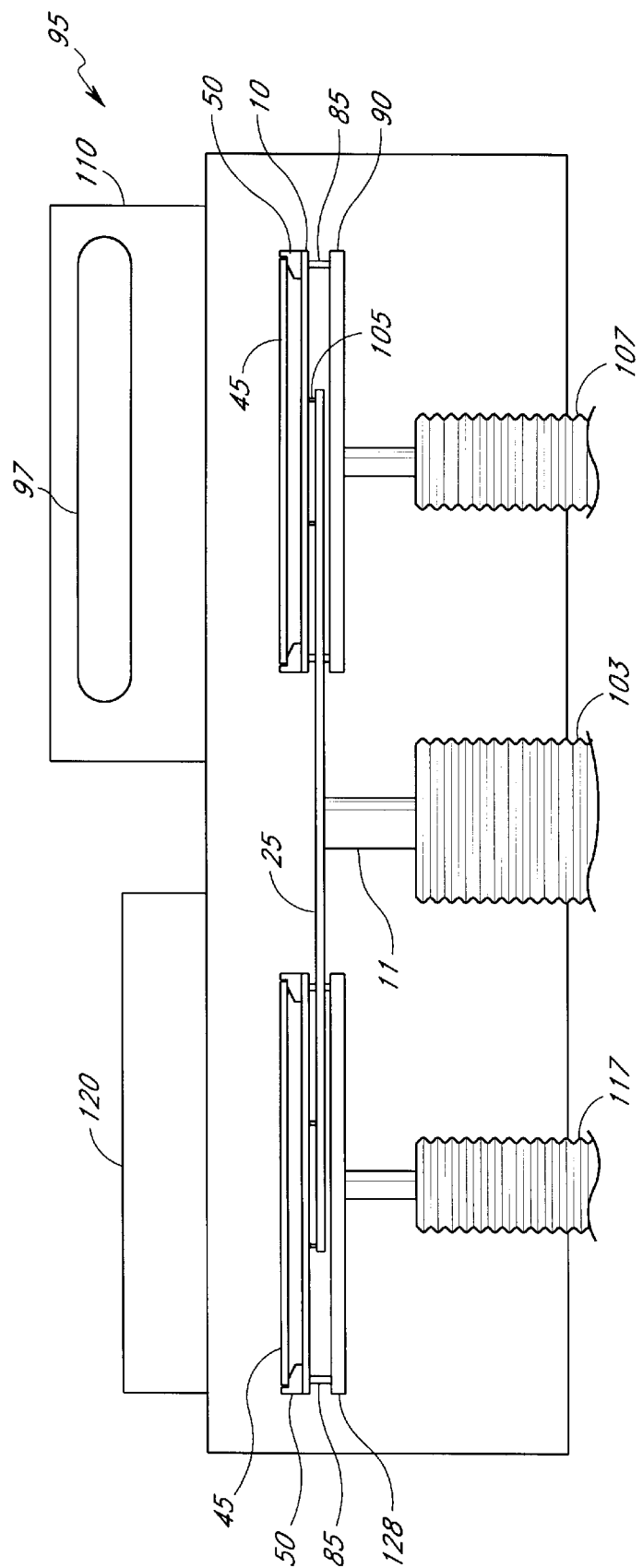
FIG. 9 is a schematic view of the wafer handling area.
Figure 9A:
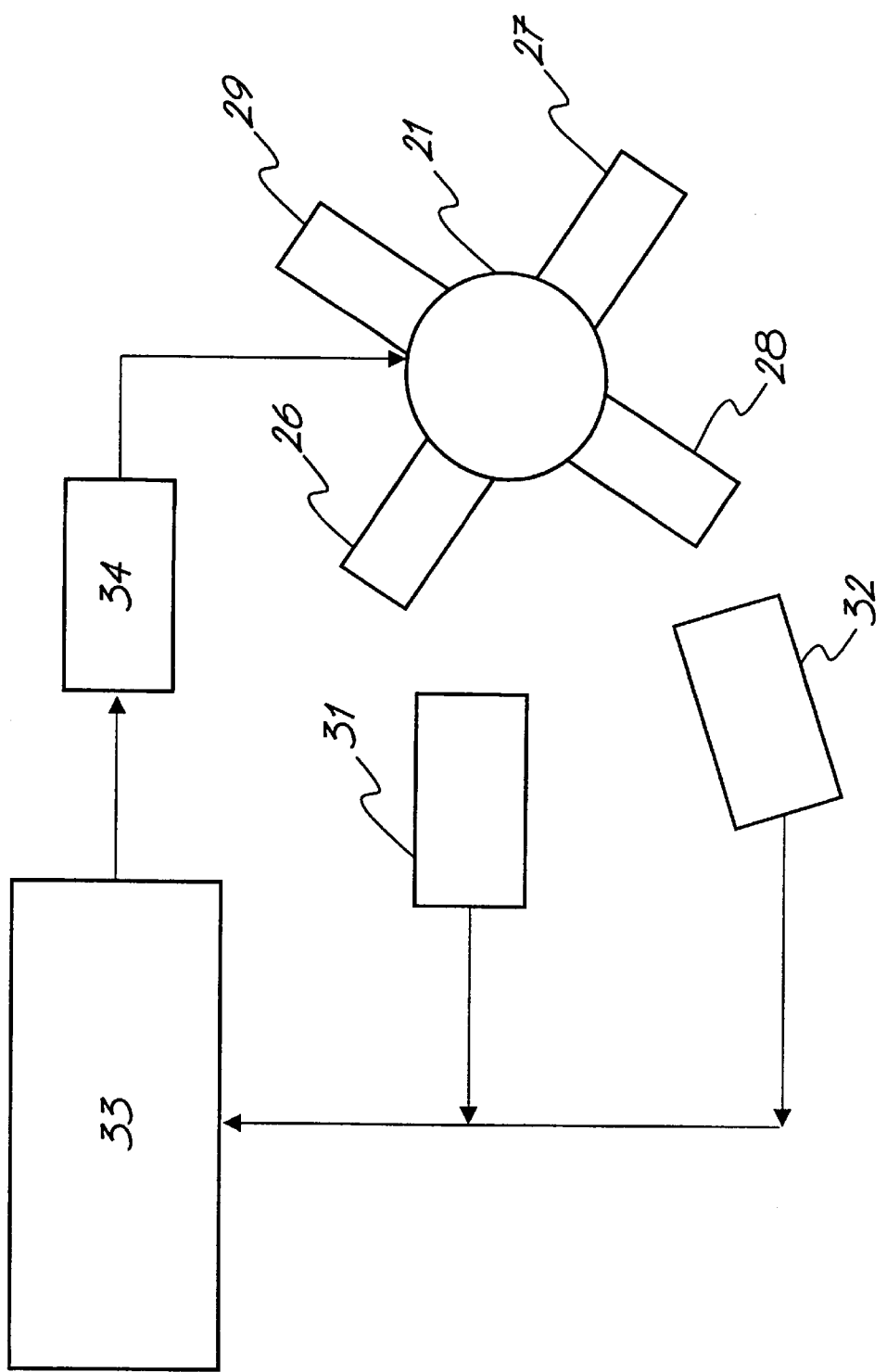
FIG. 9A is a schematic view of the output shaft, flags, sensors, control device, and drive motor.

The carrier is useful to minimize contact with the wafer in any wafer handling operation with robotic end effectors or wafer handlers. FIGS. 6–8 illustrate an arrangement for moving the carrier in a circular pattern. The wafer handler 25 has four arms 100 extending from its center at 90° intervals. The wafer handler 25 mounted on an output shaft 11, seen in FIG. 9, can rotate in a planar direction about its center in both a clockwise and counterclockwise direction. The output shaft is rotated by a variable speed drive motor 34, schematically shown in FIG. 9A. A bellows 103 permits the movement of handler 25 in the vertical direction. Four flags 26, 27, 28, and 29 are located on an input shaft 21 connected by a suitable gear and cam mechanism (not shown) to the output shaft 11. The flags trigger two sensors: a Z-lowered sensor 31, and a Z-raised sensor 32 which sense the position of the wafer handler 25 during different points of the processing cycle (see FIGS. 9, 9A). The sensors 31, 32 send signals to a control device 33 which changes the speed and acceleration of the wafer handler 25 by way of the variable speed drive motor 34.

The thickness of the tip of each arm 100 is less than the height of the space between the bottom of the carrier 10 and the top of the base plate 90, so that the handler arm 100 may be inserted in said space without shifting the carrier 10 relative to the base plate 90. While the wafer handler 25 transports carrier 10, the central portion of the carrier 10 rests upon pins 105 extending upward from the outer edge of the handler arm 100. Preferably three pins provide adequate support, while limiting contact to minimize particle formation.

Each of the stations in the wafer handling area 95 includes a base plate, approximately the same size as the wafer to be processed, and three spacers 85. The elevation and orientation of the spacers 85 facilitate the insertion of the wafer handler arms 100 under the carriers 10. The first station 112 is below the load lock chamber 110 where the atmosphere around the wafer 45 is purged. The second station may be a pre-processing station 125 where the wafer 45 may be measured or cleaned. At the third station 126, the wafer may be lifted and transferred through a gate 120 to the processing chamber and then returned to the carrier 10 after processing. The fourth station may be a post-processing station 130 where the wafer 45 may be cooled, and the thickness of a deposition layer may be measured.

Figure 10:
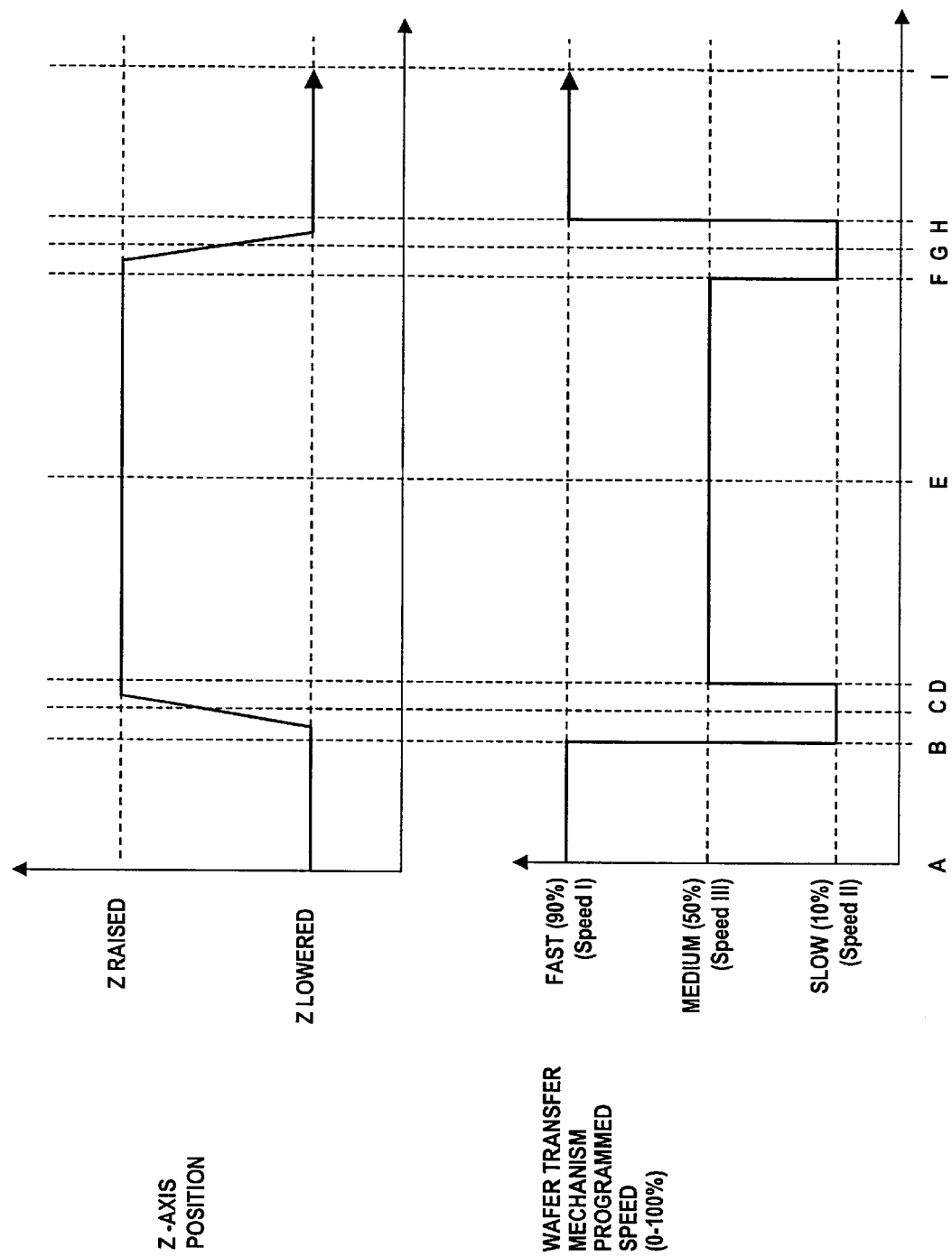
FIG. 10 is a graph illustrating the speed of the wafer handler versus the z-axis position of the wafer handler.

In operation, the robotic arm end effector 40 is inserted beneath the wafer 45 and places the wafer 45 onto the support blocks 50 on a carrier 10. The arms 100 of the wafer handler 25 rotate 45° counterclockwise from the neutral position shown in FIG. 6 to the position shown in FIG. 7. Referring to points A to B of FIG. 10, the wafer handler 25 is not carrying the carrier 10, so the wafer handler operates at a fast speed I (see FIG. 10).

As seen, an arm 100 is inserted between the spacers 85 of the first base plate 90, and between the first base plate 90 and below the carrier 10. The wafer handler arm 100 then lifts the carrier 10 with the first wafer 45 so that the carrier 10 with the first wafer 45 is resting on the pins 105 at the end of the wafer handler arm 100. Immediately before the wafer handler arm 100 lifts carrier 10, the first flag 26 triggers the first transition of the Z-lowered sensor 31, which sends a signal to the control device 33 to reduce the speed of the wafer handler 25 to a slow speed II (see FIG. 10, points B–D). Consequently, the vertical pick-up of the wafer 45 occurs very gently which minimizes particle generation of the wafer 45 by preventing shifting and chattering of the carrier 10.

As soon as the wafer handler 25 picks up the carrier 10 with the first wafer 45, the second flag 27 triggers the first transition of the Z-raised sensor 32 which sends a signal to the control device 33 to increase the speed of the wafer handler 25 to a medium speed III. Therefore, the speed of wafer handler 25 is minimized only at the most critical points of carrier transport, thereby maximizing throughput. Wafer handler 25 then rotates 90° counterclockwise at speed III until the carrier 10 and first wafer 45 are directly above a second base plate 124 (points D–F of FIG. 10). At point F, the third flag 28 triggers the second transition of the Z-raised sensor 32, and the handler lowers the carrier 10 and first wafer 45 at slow speed II (FIG. 10, points F–H) onto the second base plate 124 to facilitate a smooth wafer set-down and centers the carrier 10 so that the recesses 80 in the protuberances 70 of the wafer support blocks 50 mate with the respective spacers 85. Note that the recesses 80 are tapered to guide the spacers 85 into the desired position in the event of any slight misalignment of the carrier 10 on the handler arm 100.

After transferring the carrier 10 to the spacers 85 on the plate 124, the pins 105 on the end of the wafer handler arm 100 are no longer contacting the carrier 10. Now, the fourth flag 29 triggers the second transition of the Z-lowered sensor 31, and the wafer handler 25 rotates clockwise at fast speed I (FIG. 10, point H) so that the wafer handler arm 100 is no longer under the carrier 10 and the first wafer. Note that the spacers 85 must be properly oriented to permit this wafer handler arm 100 movement. With the spacers properly oriented, the rotation sequence could be reversed so that the arm moves 45° clockwise, then 90° clockwise, and then 45° counterclockwise to move the carrier 10 in a clockwise direction. This wafer movement process repeats so that the wafer handler 25 lifts and rotates the carrier 10 and wafer 45 through all the stations of the wafer handling area 95.

When the carrier 10 and wafer 45 return to the first base plate 90, the end effector 40 removes the wafer 45 from the carrier 10 and returns the wafer 45 to the cassette (wafer 45 can either go to the same place in the cassette or any other slot in the cassette). While the first wafer 45 is located at the second station 125, the end effector 40 transfers a second wafer to a second carrier at the first station 110. The wafer handler 25 similarly lifts and rotates the second wafer on the second carrier through the stations of the wafer handling area 95. As shown, four carriers 10 reside with the system at all times and the wafer handler arms 100 continuously transport the carriers 10 from one position to another. Thus, four wafers may be moved through the wafer handling area 95 at one time, with one wafer at each station.

It is possible to program different speeds for the wafer handler movements with the carrier, without the carrier, and while placing and picking up the carriers from the stations. This allows optimization of the handling time while also ensuring minimal particle generation, and gives the operator flexibility in customizing a motion profile specific to any desired application.

In one specific arrangement, the robotic arm end effector 40 is inserted beneath a first wafer 45 waiting to be processed from a slot in a cassette or other wafer source (not shown). The end effector 40 transfers the wafer 45 from the cassette to the support blocks 50 on a carrier 10. The carrier 10 is located on the first base plate 90 in the wafer handling area 95. A first gate valve 97 opens so that an elevator 107 raises the first base plate 90 into the load lock chamber 10, positioned above the first base plate 90, until the base plate 90 properly seats in the load lock chamber 10. The edge of the base plate 90 forms an air tight seal with a cylindrical entry to the, load lock chamber 110. While the elevator is in the raised position and the first gate, valve 97 closes, the load lock chamber 110 is purged with a purge gas.

After the purging is finished inside the load lock chamber 10, the elevator lob, below the first base plate 90 lowers the first base plate 90 from the load lock chamber 110. Then, as previously discussed above, one of the arms 100 of the wafer handler 25 rotates 45° counterclockwise at speed I from the neutral position shown in FIG. 6 to the position shown in FIG. 7. The same steps as discussed above are followed to move the wafer 45 on the carrier 10 with the wafer handler 25 to the second base plate 124.

A second gate valve 120 is positioned adjacent to a third base plate 128. An elevator 117 below the third base plate 128 raises the third base plate 128 to a higher level so that a robotic arm (not shown) may retrieve the wafer 45 to the processing chamber (not shown). Bellows 103 is preferably mechanically controlled while elevators 107 and 117 are preferably pneumatic devices. The gate valve 120 then closes and the wafer 45 is ready for processing.

After processing, the gate valve 120 opens and the robotic arm transfers the wafer 45 back to the carrier 10 on the third base plate 128, and the elevator 117 lowers the third base plate 128 at speed II. Then, as discussed above, the wafer handler arms 100 rotate the carrier 10 with the processed wafer 45 at speed III to the fourth base plate 130 for post-processing.

Once post-processing is completed, the wafer handler arms 100 once again move carrier 10 with wafer 45, as described above, back to the first base plate 90. Here, the end effector 40 is inserted beneath the wafer 45, and lifts the wafer 45 from the carrier 10 to return the wafer 45 back to the cassette.

As can be seen, four wafers may be moved through the four stations at one time, one wafer at each station. The use of the carrier 10 with the wafer 45 is not limited to transporting the wafer 45 through a wafer handling station, but may also be used in any application where a wafer must be moved. Also, the wafer handler 25 described above is not limited to rotational movement, but may move in any direction to move a carrier from one location to another.

What is claimed is:

1. A method of handling a semiconductor wafer comprising the steps of:

providing a wafer carrier having a plurality of spaced support elements defining a wafer support plane and configured to receive spaced peripheral portions of a wafer, said carrier having a frame spaced below said plane connecting the support elements;

inserting an end effector carrying a wafer between the plane and the frame to transfer a wafer to said carrier;

inserting an arm of a wafer handler beneath said carrier;

lifting said carrier without contacting the wafer;

rotating said handler, with said carrier and wafer supported by said arm, to a second station;

lowering said handler arm to transfer the carrier and wafer onto a plurality of spacers at said second station; and rotating said wafer handler arm without said carrier and wafer to a position out from beneath the carrier.

2. A method of handling a semiconductor wafer comprising the steps of:

provided a wafer carrier having a plurality of radially extending support arms having on their outer ends spaced support elements defining a wafer support plane and configured to receive spaced peripheral portions of a wafer, and having a frame below said plane connecting the support arms;

inserting an end effector carrying a wafer between the plane and the frame to transfer the wafer to said carrier by depositing the wafer on said support elements; and moving said carrier and said wafer from a first station to a second station by positioning a robotic handler to engage the frame without contacting said wafer.

3. The method of claim 2 wherein the step of moving said carrier and wafer comprises:

inserting an arm of a wafer handler between the carrier and a support;

lifting said carrier from the support;

moving said wafer handler with said carrier and wafer supported by said arm to the second station;

lowering said carrier and wafer onto a plurality of spacers at said second station; and moving said wafer handler arm without said carrier and wafer to a position out from beneath the carrier.

4. The method of claim 3, wherein said moving step includes rotating said handler.

5. The method of claim 3, wherein a plurality of wafers and carriers are lifted and rotated by wafer handler arms, to a plurality of stations, said handler arms moving beneath the carriers and avoiding contact with the spacers associated with each station that support each carrier.

6. The method of claim 3, wherein said lifting step includes vertically lifting said wafer handler arm at a slow speed.

7. The method of claim 3, wherein said moving said wafer handler with said carrier and wafer step includes rotating said wafer handler at a medium speed.

8. The method of claim 7, wherein said lowering step includes vertically lowering said wafer handler arm at a slow speed.

9. The method of claim 7, wherein said step of moving said wafer handler arm without said carrier and wafer includes rotating said wafer handler at a fast speed.

10. The method of claim 3, wherein said lowering step includes vertically lowering said wafer handler arms at a slow speed.

11. The method of claim 10, wherein said moving said step of wafer handler arm without said carrier and wafer includes rotating said wafer handler at a fast speed.

12. The method of claim 11, wherein said step of moving said wafer handler with said carrier and wafer includes rotating said wafer handler at a medium speed.

13. The method of claim 3, wherein said moving said wafer handler arm without said carrier and wafer step includes rotating said wafer handler at a fast speed.

* * * * *